(12) United States Patent
Maehara et al.

(10) Patent No.: US 8,810,770 B2
(45) Date of Patent: Aug. 19, 2014

(54) EXPOSURE APPARATUS AND ARTICLE MANUFACTURING METHOD

(75) Inventors: Yuji Maehara, Saitama (JP); Nobushige Korenaga, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 524 days.

(21) Appl. No.: 13/157,618

(22) Filed: Jun. 10, 2011

(65) Prior Publication Data

US 2011/0310366 A1    Dec. 22, 2011

(30) Foreign Application Priority Data

Jun. 16, 2010   (JP) ................................. 2010-137473

(51) Int. Cl.
  *G03B 27/52*  (2006.01)
  *G03B 27/58*  (2006.01)
  *G03B 27/60*  (2006.01)

(52) U.S. Cl.
  USPC ................................. 355/30; 355/72; 355/73

(58) Field of Classification Search
  USPC ................................... 355/30, 77, 72, 73, 74
  See application file for complete search history.

(56) References Cited

U.S. PATENT DOCUMENTS

| | | | |
|---|---|---|---|
| 5,363,196 A * | 11/1994 | Cameron | 356/500 |
| 5,661,548 A * | 8/1997 | Imai | 355/55 |
| 5,870,198 A * | 2/1999 | Takagi | 356/500 |
| 6,264,165 B1 * | 7/2001 | Ohtomo et al. | 248/694 |
| 7,027,131 B2 * | 4/2006 | Terashima | 355/75 |
| 7,864,298 B2 * | 1/2011 | Sekine | 355/72 |
| 2003/0035088 A1 * | 2/2003 | Emoto | 355/53 |
| 2004/0169832 A1 * | 9/2004 | Shimoda | 355/30 |
| 2004/0256574 A1 * | 12/2004 | Namba | 250/492.1 |
| 2007/0153244 A1 * | 7/2007 | Zaal et al. | 355/30 |
| 2008/0151202 A1 * | 6/2008 | Ohishi | 355/30 |
| 2009/0190908 A1 * | 7/2009 | Shibagaki | 392/416 |

FOREIGN PATENT DOCUMENTS

| | | | | |
|---|---|---|---|---|
| JP | 06124873 A | * | 5/1994 | ............ H01L 21/027 |
| JP | 9-092613 A | | 4/1997 | |

* cited by examiner

*Primary Examiner* — Peter B Kim
*Assistant Examiner* — Deoram Persaud
(74) *Attorney, Agent, or Firm* — Canon USA, Inc. IP Division

(57) ABSTRACT

An apparatus for exposing a substrate to an energy in a vacuum includes a substrate stage having a mirror surface; a mirror configured to deflect a light into a Z axis direction; a measuring device configured to measure the stage position in the Z axis direction with the light in which the mirror surface is irradiated; a driving device configured to move the measuring device so that the mirror surface is irradiated with the light; an optical system configured to project the energy onto the substrate; and a cooling device including a radiation plate (arranged between the optical system and the stage in the Z axis direction and having a first opening which the energy passes and a second opening which the light passes), including a cooler configured to cool the first radiation plate, and configured to perform radiation cooling of the substrate.

23 Claims, 7 Drawing Sheets

EXPOSURE APPARATUS AND ARTICLE MANUFACTURING METHOD

BACKGROUND OF THE INVENTION

1. Field of the Invention

The present invention relates to an exposure apparatus for exposing a substrate to an energy in a vacuum.

2. Description of the Related Art

An extreme ultraviolet radiation (EUV) exposure apparatus and an electron beam exposure (drawing) apparatus which are currently developed as a next generation semiconductor exposure apparatus exposes a substrate to an energy in a vacuum environment. Since heat is not transferred by convection in a vacuum environment, heat is liable to accumulate within an object. For this reason, in the above exposure apparatus, countermeasures against heat are one of important developmental elements.

As one of the countermeasures against heat, there is a method for circulating a cooling fluid through the structure of the exposure apparatus. This method, however, vibrates the structure along with the circulation of the fluid, so that the method must be carefully applied to the exposure apparatus of which high resolving power and overlay accuracy are required. Japanese Patent Application Laid-Open No. 09-092613 discusses a technique, as another countermeasure, in which heat radiation is used to adjust temperature of a mask and a wafer.

An exposure apparatus has been known which moves a laser beam coming from a measuring device (ex. a laser interferometer) which measures the position of a stage, that holds a substrate and is moved, with the laser beam. The laser beam is moved so that it is always incident on a light reflection surface of the upper surface of the stage. It is difficult, however, to arrange a radiation plate in the exposure apparatus because the optical path of the laser beam needs to be ensured. Even if the radiation plate can be arranged, if a necessary cooling capacity cannot be ensured, countermeasures for that are required.

SUMMARY OF THE INVENTION

According to an aspect of the present invention, an apparatus for exposing a substrate to an energy in a vacuum includes a stage having a mirror surface and configured to hold the substrate so that a surface of the substrate to be exposed is arranged along an X-Y plane, a mirror configured to deflect a light into a direction of a Z axis orthogonal to the X-Y plane, a measuring device configured to measure a position of the stage in the direction of the Z axis with the light in which the mirror surface is irradiated via the mirror, a first driving device configured to move the measuring device in accordance with a movement of the stage so that the mirror surface is irradiated with the light, an optical system configured to project the energy onto the substrate, and a first cooling device including a first radiation plate which is arranged between the optical system and the stage in the direction of the Z axis and has a first opening which the energy passes and a second opening which the light moved in accordance with the movement of the measuring device passes, including a first cooler configured to cool the first radiation plate, and configured to perform radiation cooling of the substrate.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

In the description, reference is made to accompanying drawings, which form apart thereof, and which illustrate an example of the invention. Such example, however, is not exhaustive of the various embodiments of the invention, and therefore reference is made to the claims which follow the description for determining the scope of the invention.

Figure 3:
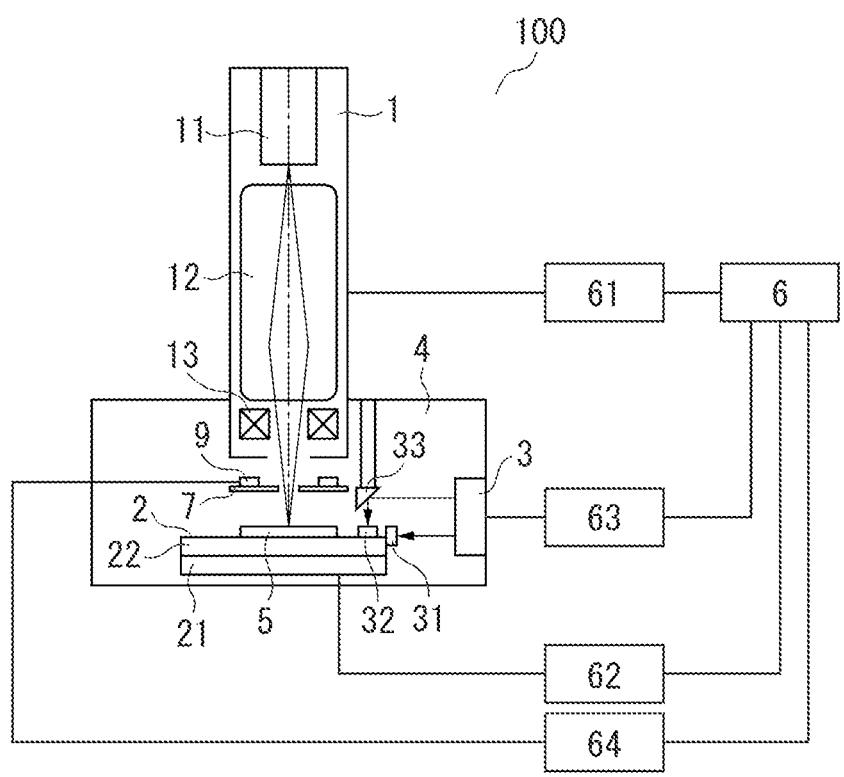
FIG. 3 is a block diagram of an electron beam exposure (drawing) apparatus according to the present invention.

FIG. 3 is a block diagram of an electron beam drawing apparatus (also referred to as electron beam exposure apparatus) according to a first exemplary embodiment. An electron beam drawing apparatus 100 mainly includes an electro-optical system 1, a wafer stage 2, a length measuring interferometer (measuring device) 3, and a vacuum chamber 4. A vacuum pump (not illustrated) evacuates air from the vacuum chamber 4. The electro-optical system 1, the wafer stage 2 which is movable in a direction of X, Y, and Z axes which are orthogonal to one another, and the length measuring interferometer 3 are arranged within the vacuum chamber 4.

The electro-optical system 1 includes an electron gun 11 for emitting an electron beam, an electron lens system 12 for converging the electron beam from the electron gun 11, and a deflector 13 for deflecting the electron beam. The above components are controlled by an electro-optical system control unit 61. In the electro-optical system control unit 61, when a pattern is drawn on a wafer 5, the deflector 13 deflects an electron beam to perform scanning and controls the irradiation of the electron beam according to a pattern to be drawn. The electron beam may be a charged particle beam such as an ion beam.

The wafer stage 2 may be configured such that a micromotion stage 22 is placed on a coarse motion stage 21. The wafer 5 onto which a photo-sensitive material (also referred to as photoresist) is applied is held on the micromotion stage 22 so that the surface to be exposed is arranged along the X-Y plane. The stages can be moved using a known actuator such as a linear motor. Furthermore, an X-axis reflecting mirror 31, a Y-axis reflecting mirror (not illustrated), and a Z-axis reflecting mirror 32 (a reflecting mirror is also referred to as a mirror plane) are arranged on the micromotion stage 22. The coarse motion stage 21 moves in the X and Y directions in the plane (X-Y plane) perpendicular to the optical axis (Z axis) of the electron lens system 12 to coarsely align the wafer 5. The micromotion stage 22 moves in the X, Y, and Z directions to finely align the wafer 5. Furthermore, the micromotion stage 22 may rotate around a rotation axis parallel with the X, Y, and Z axes to finely align the wafer 5. The position of the coarse motion stage 21 and the micromotion stage 22 is controlled by a wafer stage control unit 62.

The length measuring interferometer 3 splits a laser beam emitted from a laser light source provided therein into measuring light and reference light. The measuring light is incident on the X-axis reflecting mirror 31 arranged on the wafer stage 2 and the reference light is incident on a reference mirror. The reflected measuring light and reference light are superimposed and interfere with each other. The intensity of the interference light is detected by a detector. Since the measuring light and the reference light differ from each other in frequency by a very small amount of Δf at the time of emission, the detector outputs a beat signal. Frequency of the beat signal changes from Δf according to the movement speed in the direction X of the reflecting mirror 31 for X-axis. A stage position detection unit 63 processes the beat signal to measure the amount of change of an optical path length of the measuring light in a high resolving power and accuracy using the optical path length of the reference light as a reference. In other words, the X coordinate of the reflecting mirror 31 for X-axis (X coordinate of the wafer stage 2) is measured using the reference mirror as a reference. Similarly, the Y coordinate of the reflecting mirror for Y-axis arranged on the wafer stage 2 and the Z coordinate of the reflecting mirror 32 for Z-axis arranged on the wafer stage 2 are measured using the reference mirror as a reference in a high resolving power and accuracy. The laser beam for measuring the Z axis, which travels along the X-Y plane (parallel to the X-Y plane) is reflected by a folding mirror 33 and incident on the reflecting mirror for Z-axis from the Z direction. The folding mirror 33 is supported by the same frame as that supporting the electro-optical system 1.

Figure 1:
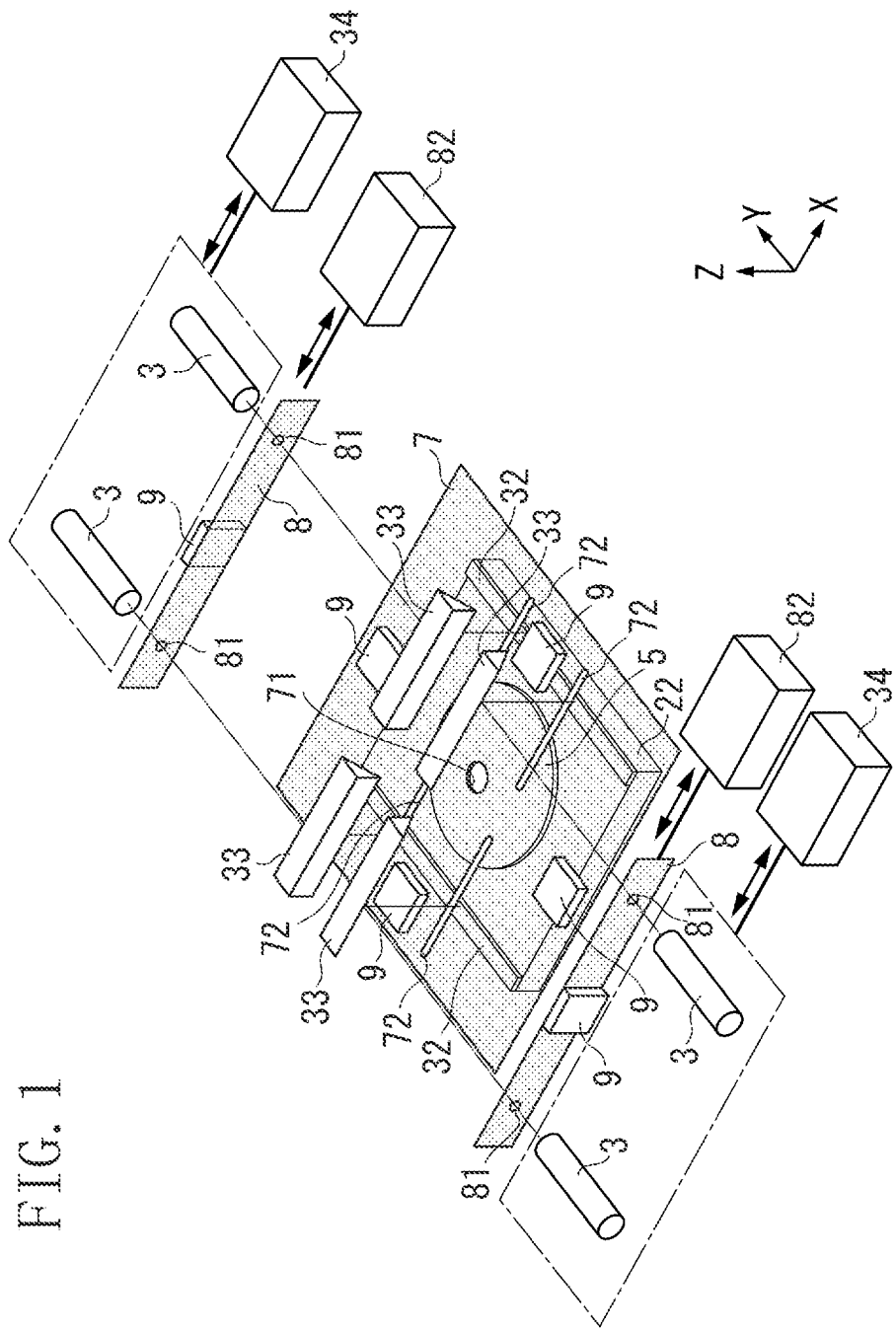
FIG. 1 is a schematic diagram illustrating a part of an exposure apparatus according to a first exemplary embodiment.

FIG. 1 is a schematic diagram illustrating a part of the exposure apparatus according to the first exemplary embodiment of the present invention.

A temperature adjustment unit (cooling device) according to the present exemplary embodiment includes radiation plates 7 and 8 and a temperature adjuster (cooler) 9. A first cooling device is comprised of the radiation plate 7 (a first radiation plate) and the temperature adjuster (a first cooler) 9 corresponding thereto. A second cooling device is comprised of the radiation plate 8 (a second radiation plate) and the temperature adjuster (a second cooler) 9 corresponding thereto. The radiation plates 7 and 8 are a structure including a high radiation-rate material such as a ceramics plate with a high radiation rate or a metal plate whose radiation rate is increased by surface treatment such as plating or mist coating. The radiation plates 7 and 8 are arranged opposing the wafer 5.

The radiation plate 7 is provided with an opening 71 (a first opening) for transmitting exposure light and an opening 72 (a second opening) for transmitting an interferometer beam, which is long in the X direction. The opening 72 has a shape that transmits a laser beam over the movement range of the measuring device which is driven by a measuring device driving device (a first driving device) as described below.

The radiation plate 8 is arranged such that its surface is orthogonal to the interferometer beam emitted from a length measuring interferometer 3. The radiation plate 8 has an opening 81 (a third opening) for transmitting the interferometer beam. A temperature adjuster 9 is placed on the radiation plates 7 and 8 and adjusts the radiation plates 7 and 8 to a predetermined target temperature. A Peltier element may be used for the temperature adjuster 9. Instead of or together with the Peltier element, other cooling devices may be used, i.e., a piping or a jacket for transmitting temperature-controlled medium (fluid), for example, may be used as a cooler. Alternatively, two or more temperature adjusters are provided on at least one of the radiation plates 7 and 8 to adjust temperature differently from each other, thereby allowing such a radiation plate to have a temperature distribution. In this way, the radiation plate can have a temperature distribution according to the temperature distribution of the wafer to permit the temperature of the wafer to be effectively adjusted.

The wafer 5 and the Z-axis reflecting mirror 32 are placed on the micromotion stage 22 and hence moved according to movement of the wafer stage 2 (in each direction of six axes, for example). The length measuring interferometer 3 is moved in the X direction by its driving device 34 (a measuring device driving device or a first driving device) along with the movement of the micromotion stage 22. The radiation plate 8 is moved in the X direction by its driving device 82 (a radiation plate driving device or a second driving device) along with the movement of the length measuring interferometer 3 so that the interferometer beam of the length measuring interferometer 3 passes through the opening 81. The measuring device driving device and the radiation plate driving device may be formed as an integral driving device which shares an actuator. The electro-optical system 1 (refer to FIG. 1), the radiation plate 7 (and the temperature adjuster 9 which accompanies the radiation plate 7), and the folding mirror 33 are placed on a frame (not illustrated) of the exposure apparatus and do not move. The temperature adjuster 9 is controlled by a temperature adjuster control unit 64 so that the temperature of the radiation plates 7 and 8 can be equal to a target temperature corresponding to the temperature of the wafer 5.

A main control unit 6 processes data from the electro-optical system control unit 61, the wafer stage control unit 62, the stage position detection unit (measuring device control unit) 63, and the temperature adjuster control unit 64 and issues instructions to the control units. The control units are collectively referred to simply as a control unit.

Figure 4:
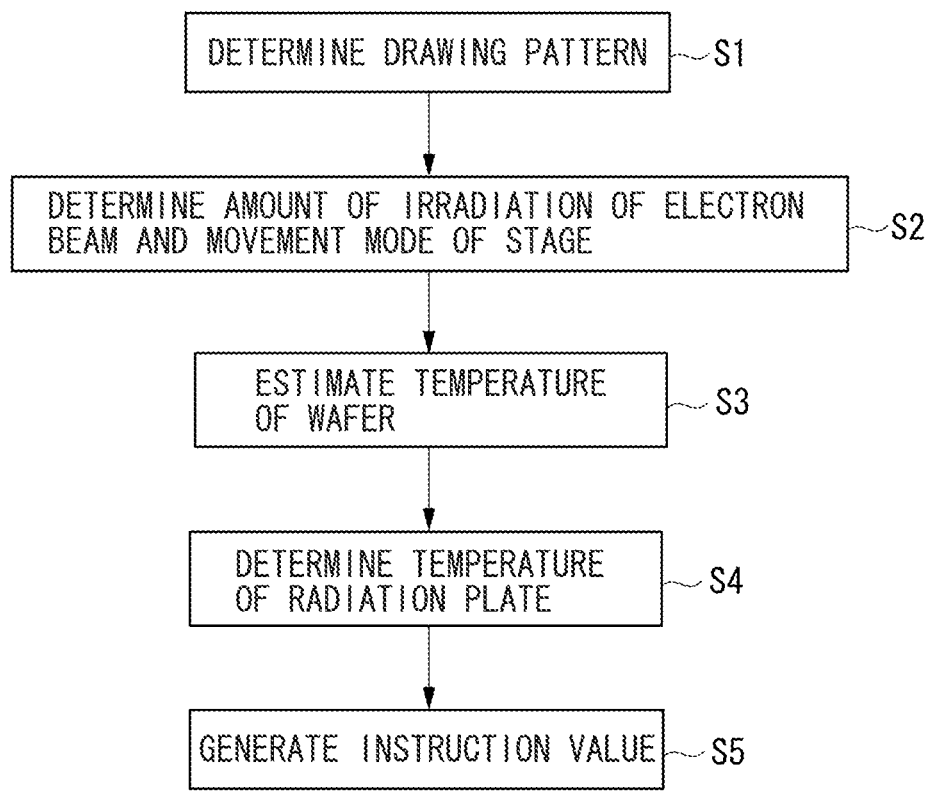
FIG. 4 is a flow chart illustrating the procedure of a process in a control unit.

The electron beam drawing apparatus 100 draws a pattern on each of a plurality of shot areas of the wafer 5 by a step and repeat operation. Patterns are drawn on the wafer 5 placed on the wafer stage 2 by controlling the deflector 13 deflecting an electron beam and the position of the wafer stage 2. The main control unit 6 issues instructions to the temperature adjuster control unit 64 according to the amount of irradiation of an electron beam and the movement mode of the wafer stage. The instructions are issued by the main control unit 6 (control unit) according to the procedure of process described in a flow chart in FIG. 4, for example.

In step S1, a pattern to be drawn on the wafer 5 is determined. In step S2, the amount of irradiation of an electron beam and the movement mode of the wafer stage 2 are determined according to the pattern determined instep S1. In step S3, the temperature and temperature distribution of the wafer from moment to moment in a time period during which one wafer is exposed, for example, is estimated based on the amount of irradiation of an electron beam and the movement mode of the wafer stage 2 determined in step S2.

In step S4, the temperature and temperature distribution of the radiation plates 7 and 8 are determined based on the temperature and temperature distribution of the wafer estimated in step S3. In step S5, an instruction value corresponding to the temperature and temperature distribution determined in step S4 is generated and given to the temperature adjuster control unit 64. The temperature adjuster control unit 64 controls the temperature adjuster 9 according to the instruction value given in that way.

When drawing (exposure) is started, the wafer 5 absorbs the energy of an electron beam (exposure light) to increase its temperature. Increase in the temperature of the wafer 5 changes the relative position between the wafer 5 and the micromotion stage 22 due to the thermal strain of the wafer, which causes a problem that a target position cannot be irradiated with an electron beam. On the other hand, when the temperature of the radiation plates 7 and 8 is lowered by the temperature adjuster 9, variation in the temperature of the wafer 5 can be suppressed by radiation cooling. Consequently, displacement in the relative position between the wafer 5 and the micromotion stage 22 can be decreased. The radiation of heat is performed by the folding mirror 33 between the wafer 5 and the radiation plate 8.

The amount of heat transferred by radiation depends on the area of an interface unit (surface) at which an object (the wafer 5) whose temperature is adjusted and the radiation plate are opposed to each other, and difference in temperature between the object and the radiation plate. The smaller the area and the difference in temperature, the smaller the amount of heat transferred by radiation. The larger the area and the difference in temperature, the larger the amount of heat transferred by radiation. For this reason, if the area of a portion where the wafer 5 and the radiation plate are opposed to each other cannot be sufficiently increased, it is necessary to increase the difference in temperature between the wafer 5 and the radiation plate (to further lower the temperature of the radiation plate). if the temperature of the radiation plate is further lowered, it greatly affects other units (the frame for supporting the electro-optical system 1, for example) which should not be cooled. Furthermore, a problem is caused in that a temperature adjuster with higher cooling capacity is required.

Figure 2:
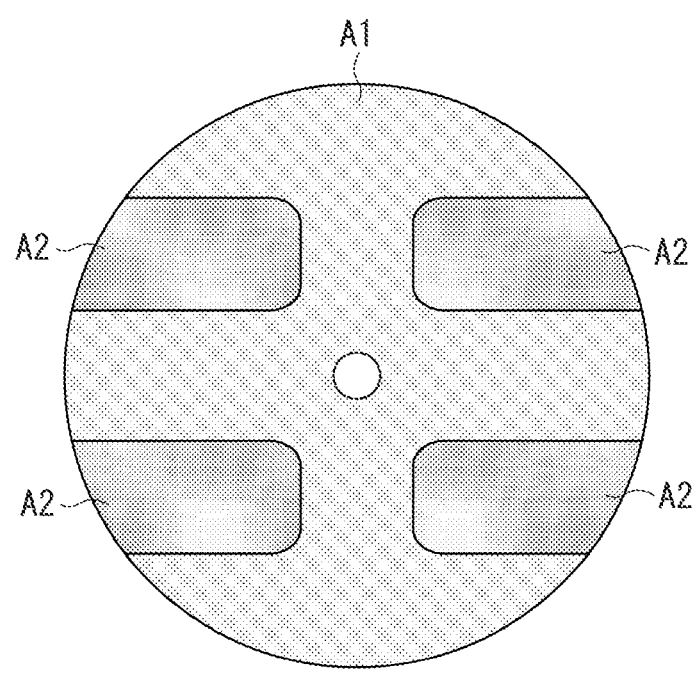
FIG. 2 illustrates an example of relative positional relationship between a radiation plate (a first radiation plate) and a substrate.

If the radiation plate 8 does not exist, the area where the wafer 5 and the radiation plate are opposed to each other is limited only to an area A1 illustrated in FIG. 2. In the present exemplary embodiment, since the radiation plate 8 exists, the area where the wafer 5 and the radiation plate are opposed to each other is equal to the area A1 and an area A2 illustrated in FIG. 2. For this reason, the present exemplary embodiment is advantageous in light of at least either of a small influence on other units or a low cooling capacity of the temperature adjuster.

Figure 5:
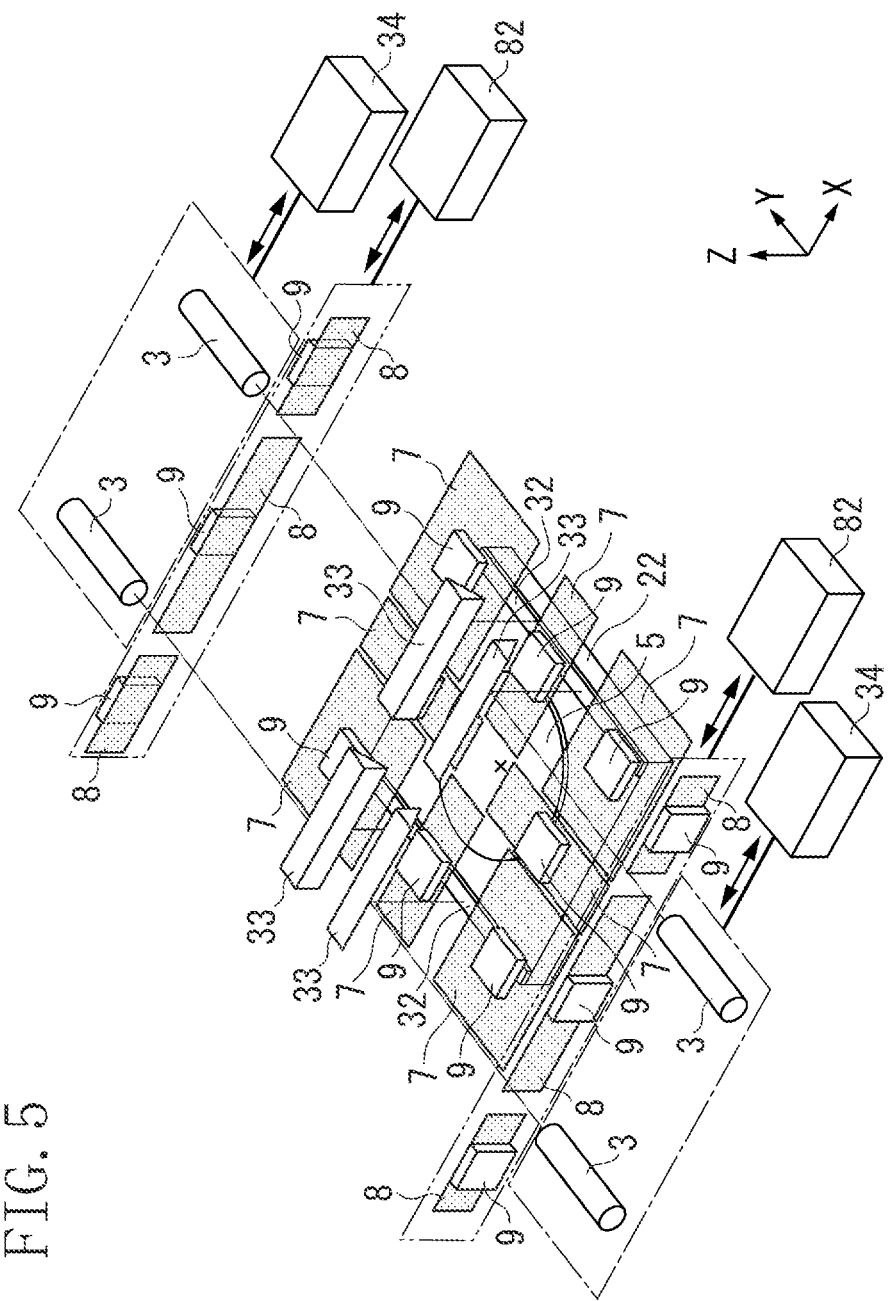
FIG. 5 is a schematic diagram illustrating a part of an exposure apparatus according to a second exemplary embodiment.

FIG. 5 is a schematic diagram illustrating a part of an exposure apparatus according to a second exemplary embodiment of the present invention. The components similar to those described in the first exemplary embodiment are given the same references, so that the description thereof is omitted or simplified.

In the second exemplary embodiment, the radiation plates 7 and 8 are divided to a plurality of elements of radiation plates. Each of the plurality of elements of radiation plates is provided with the temperature adjuster 9. Thus, the radiation plates are divided into the plurality of elements of radiation plates and the temperature of each of the radiation plates is adjusted differently, so that a diversified temperature distribution of the wafer can be dealt with.

The openings 71, 72, and 81 in FIG. 1 are formed as a gap between the plurality of elements of radiation plate 7 or a gap between the plurality of elements of radiation plate 8 in a configuration in FIG. 5. Such a gap is regarded as the opening of the radiation plates in which the whole elements of radiation plate 7 and radiation plate 8 are each taken as one radiation plate.

Figure 6:
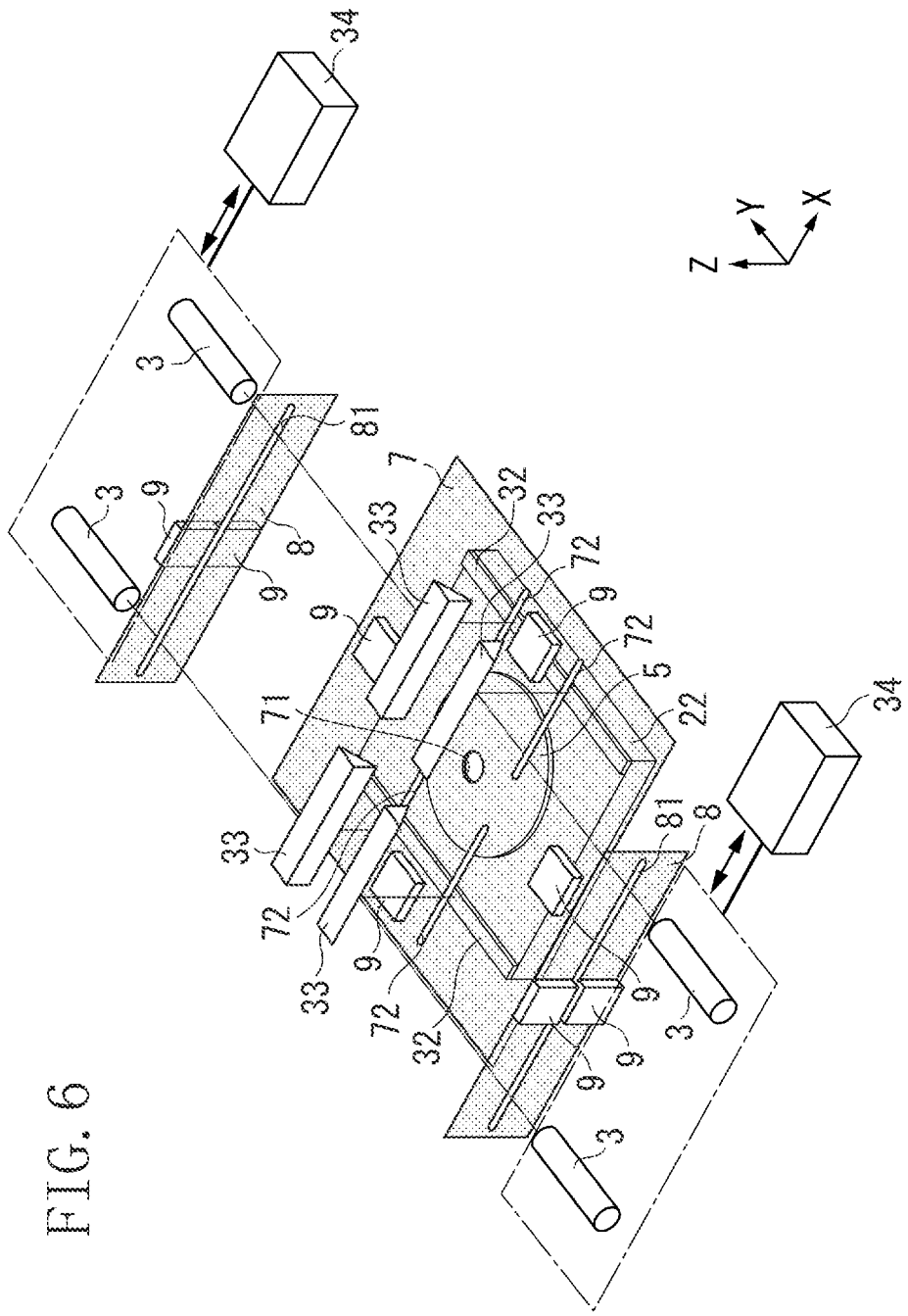
FIG. 6 is a schematic diagram illustrating a part of an exposure apparatus according to a third exemplary embodiment.

FIG. 6 is a schematic diagram illustrating a part of an exposure apparatus according to a third exemplary embodiment of the present invention. The components similar to those described in the first exemplary embodiment are given the same references, so that the description thereof is omitted or brief.

In the third exemplary embodiment, an opening 81 provided on the radiation plate 8 is a long slot provided in the direction in which the length measuring interferometer 3 is moved. This allows placing of the radiation plate 8 on the exposure apparatus (not illustrated) omitting a driving device 82. The radiation plate 8 is arranged in a position far from the radiation plate 7. For this reason, when the divergence of heat radiation is taken into consideration, the influence of the opening 81 on radiation cooling of the wafer 5 is smaller than the influence of the opening 72 on radiation cooling of the wafer 5. Consequently, the configuration described in the present exemplary embodiment can be employed.

Figure 7:
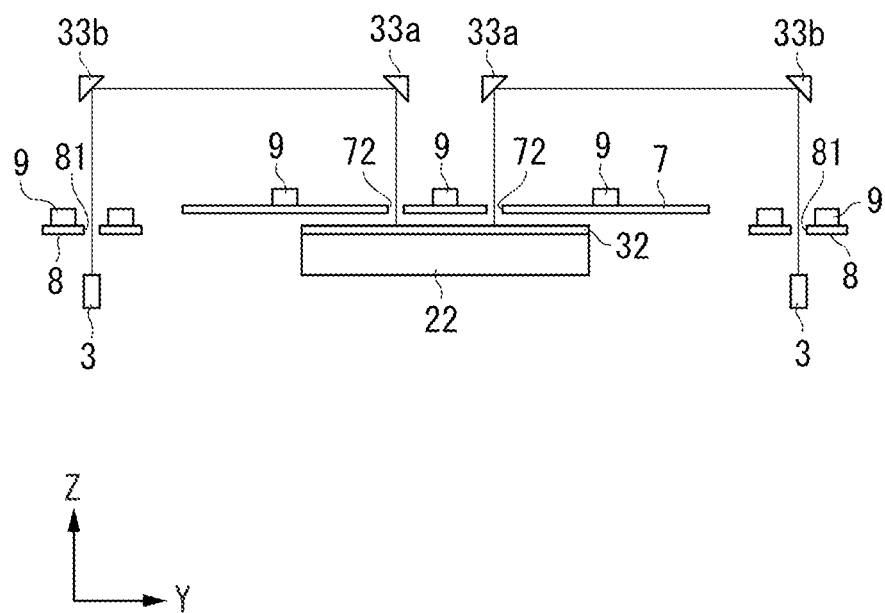
FIG. 7 is a schematic diagram illustrating a part (modification) of an exposure apparatus.

Although the above exemplary embodiment describes an example where the radiation plate 8 is arranged along the vertical plane, the radiation plate 8 may be arranged along the horizontal plane such that a laser beam is bent twice by folding mirrors 33a and 33b as illustrated in FIG. 7.

A method for producing a device or an article (such as a liquid crystal display device, an optical element, and a mask for lithography apparatus (exposure apparatus) and others) will be explained as a fourth exemplary embodiment taking a method for producing a semiconductor device as an example. A semiconductor device is produced through a pre-process in which an integrated circuit is formed on a wafer (substrate) and a post-process in which the integrated circuit formed on the wafer in the pre-process is finished. The pre-process includes a process in which drawing is performed on a wafer onto which a resist (a photosensitive material) is applied, with an electron beam using the aforementioned electron beam drawing apparatus (exposure apparatus) and a process in which the wafer on which drawing is performed (exposed) in the drawing (exposure) process is developed. The post-process includes an assembly process (dicing and bonding) and a packaging process (enclosure). The method for producing a device according to the present exemplary embodiment is more advantageous in light of at least one of the performance, quality, productivity, and production cost of the article than a conventional method.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

For example, the present invention is applicable not only to an electron beam exposure apparatus for exposing a substrate to an energy in a vacuum, but also to an exposure apparatus for exposing a substrate to an energy in a vacuum using a vacuum ultraviolet light source or an EUV light source such as ArF excimer laser and F2 laser as a light source.

This application claims priority from Japanese Patent Application No. 2010-137473 filed Jun. 16, 2010, which is hereby incorporated by reference herein in its entirety.

What is claimed is:

1. An apparatus for exposing a substrate to an energy in a vacuum, the apparatus comprising:

a stage having a mirror surface and configured to hold the substrate so that a surface of the substrate to be exposed is arranged along an X-Y plane;

a mirror configured to deflect a light into a direction of a Z axis orthogonal to the X-Y plane;

a measuring device configured to measure a position of the stage in the direction of the Z axis with the light in which the mirror surface is irradiated via the mirror;

a first driving device configured to move the measuring device in accordance with a movement of the stage so that the mirror surface is irradiated with the light;

an optical system configured to project the energy onto the substrate;

a first cooling device including a first radiation plate which is arranged between the optical system and the stage in the direction of the Z axis and has a first opening which the energy passes and a second opening which the light moved in accordance with the movement of the measuring device passes, including a first cooler configured to cool the first radiation plate, and configured to perform radiation cooling of the substrate; and a second cooling device including a second radiation plate having a third opening which a light to be deflected by the mirror passes, including a second cooler configured to cool the second radiation plate, and configured to perform radiation cooling of the substrate via the mirror and the second opening.

2. The apparatus according to claim 1, wherein the third opening has a shape that the light passes the third opening over a movement range of the measuring device moved by the first driving device.

3. The apparatus according to claim 1, further comprising a second driving device configured to move the second radiation plate in accordance with the movement of the stage so that the light passes the third opening.

4. The apparatus according to claim 3, wherein the first and second driving devices share an actuator.

5. The apparatus according to claim 1, wherein the energy includes a charged particle beam.

6. The apparatus according to claim 1, wherein at least one of the first and second cooling devices is configured to cause corresponding at least one of the first and second radiation plates to have temperatures different by location thereof.

7. The apparatus according to claim 1, wherein at least one of the first and second cooling devices includes a plurality of radiation plate elements in corresponding at least one of the first and second radiation plates, and includes a plurality of coolers configured to respectively cool the plurality of radiation plate elements.

8. The apparatus according to claim 1, further comprising a controller configured to control at least one of the first and second cooling devices, wherein the controller is configured to predict a temperature distribution in the substrate, and to control the at least one of the first and second cooling devices in accordance with the predicted temperature distribution to cause corresponding at least one of the first and second radiation plates to have temperatures different by location thereof.

9. The apparatus according to claim 8, wherein the controller is configured to predict the temperature distribution based on a value of the energy in which the substrate moved with the movement of the stage is irradiated via the optical system and a mode of the movement.

10. A method of manufacturing an article, the method comprising:

exposing a substrate to an energy using the apparatus defined in claim 1;

developing the exposed substrate; and processing the developed substrate to manufacture the article.

11. The method according to claim 10, wherein the energy includes a charged particle beam.

12. The method according to claim 10, wherein the third opening of the apparatus has a shape that the light passes the third opening over a movement range of the measuring device moved by the first driving device.

13. The method according to claim 10, wherein the apparatus further comprises a second driving device configured to move the second radiation plate in accordance with the movement of the stage so that the light passes the third opening.

14. The method according to claim 13, wherein the first and second driving devices of the apparatus share an actuator.

15. The method according to claim 10, wherein at least one of the first and second cooling devices of the apparatus is configured to cause corresponding at least one of the first and second radiation plates to have temperatures different by location thereof.

16. The method according to claim 10, wherein at least one of the first and second cooling devices of the apparatus includes a plurality of radiation plate elements in corresponding at least one of the first and second radiation plates, and includes a plurality of coolers configured to respectively cool the plurality of radiation plate elements.

17. The method according to claim 10, wherein the apparatus further comprises a controller configured to control at least one of the first and second cooling devices, wherein the controller is configured to predict a temperature distribution in the substrate, and to control the at least one of the first and second cooling devices in accordance with the predicted temperature distribution to cause corresponding at least one of the first and second radiation plates to have temperatures different by location thereof.

18. The method according to claim 17, wherein the controller of the apparatus is configured to predict the temperature distribution based on a value of the energy in which the substrate moved with the movement of the stage is irradiated via the optical system and a mode of the movement.

19. An exposure apparatus for exposing a substrate in a vacuum, the exposure apparatus comprising:

an optical system configured to emit energy onto the substrate;

a stage, a mirror surface, configured to move along an X-Y plane perpendicular to an optical axis of the optical system while holding the substrate;

a mirror configured to deflect a laser beam, the laser beam travelling along the X-Y plane into a Z direction parallel to the optical axis;

a measuring device configured to measure a position of the stage in the Z direction using the laser beam which is irradiated onto the mirror surface via the mirror;

a driving device configured to move the measuring device in accordance with a movement of the stage so that the laser beam is irradiated onto the mirror surface;

a first cooling device, including a first radiation plate that has a first opening through which the energy passes and a second opening through which the laser beam passes over a movement range of the measuring moved by the driving device, the first radiation plate being arranged between the optical system and the stage in the Z direction, and a first cooler that cools the first radiation plate, configured to perform radiation cooling of the substrate; and a second cooling device, including a second radiation plate that has a third opening through which the laser beam, the laser beam travelling along the X-Y plane, passes, and a second cooler that cools the second radiation plate, configured to perform radiation cooling of the substrate through the second opening via the mirror.

20. An exposure apparatus for exposing a substrate in a vacuum, the exposure apparatus comprising:

an optical system configured to emit energy onto the substrate;

a stage, including a mirror surface, configured to move along a plane perpendicular to an optical axis of the optical system while holding the substrate;

a measuring device configured to measure a position of the stage in a direction parallel to the optical axis using a laser beam which is irradiated onto the mirror surface;

a driving device configured to move the measuring device in accordance with a movement of the stage so that the laser beam is irradiated onto the mirror surface;

a first cooling device, including a first radiation plate that has a first opening through which the energy passes and a second opening through which the laser beam passes over a movement range of the measuring device moved by the driving device, the first radiation being arranged between the optical system and the stage, and a first cooler that cools the first radiation plate, configured to perform radiation cooling of the substrate; and a second cooling device, including a second radiation plate that has a third opening through which the laser beam passes, the second radiation being arranged between the measuring device and the stage, and a second cooler that cools the second radiation plate, configured to perform radiation cooling of the substrate.

21. An exposure apparatus for exposing a substrate, the exposure apparatus comprising:

a stage, including a mirror surface, configured to move while holding the substrate;

a measuring device configured to measure a position of the stage using a measurement light which is irradiated onto the mirror surface and which is reflected by the mirror surface;

a radiation plate, a temperature of the radiation plate being adjustable, having an opening and being arranged between the measuring device and the mirror surface;

a first driving device configured to move the measuring device in accordance with a movement of the stage; and a second driving device configured to move the radiation plate, wherein the second driving device moves the radiation plate in accordance with the movement of the stage so that the measurement light passes through the opening.

22. An exposure apparatus for exposing a substrate, the exposure apparatus comprising:

a stage, including a mirror surface, configured to move while holding the substrate;

a measuring device configured to measure a position of the stage using a measurement light with which is irradiated onto the mirror surface and which is reflected by the mirror surface; and a radiation plate, a temperature of the radiation plate being adjustable, being arranged between the measuring device and the mirror surface, wherein the mirror surface is lengthened in a direction parallel to a movement direction of the stage, and wherein the radiation plate has an opening through which the measurement light passes.

23. An exposure apparatus for exposing a substrate, the exposure apparatus comprising:

a stage, including a mirror surface and configured to move while holding the substrate;

a measuring device configured to measure a position of the stage using a measurement light which is irradiated onto the mirror surface and which is reflected by the mirror surface;

a first radiation plate, a temperature of the first radiation plate being adjustable, having a first opening through which the measurement light passes and being arranged between the measuring device and the mirror surface in an optical path of the measurement light; and a second radiation plate, a temperature of the second radiation plate being adjustable, having a second opening through which the measurement light passes and being arranged between the measuring device and the first radiation plate in the optical path of the measurement light, wherein the second opening of the second radiation plate is smaller than the first opening of the first radiation plate.

* * * * *